(12) United States Patent
Ishihara

(10) Patent No.: US 10,051,736 B2
(45) Date of Patent: Aug. 14, 2018

(54) PRINTED WIRING BOARD AND METHOD FOR MANUFACTURING PRINTED WIRING BOARD

(71) Applicant: IBIDEN CO., LTD., Ogaki (JP)

(72) Inventor: Teruyuki Ishihara, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/414,918

(22) Filed: Jan. 25, 2017

(65) Prior Publication Data
US 2017/0215282 A1 Jul. 27, 2017

(30) Foreign Application Priority Data
Jan. 26, 2016 (JP) .................. 2016-012464

(51) Int. Cl.
| | |
|---|---|
| H05K 1/11 | (2006.01) |
| H05K 3/46 | (2006.01) |
| H05K 1/03 | (2006.01) |
| H05K 3/40 | (2006.01) |
| H05K 3/06 | (2006.01) |
| H05K 3/00 | (2006.01) |

(52) U.S. Cl.
CPC ........... H05K 1/115 (2013.01); H05K 1/0313 (2013.01); H05K 3/0032 (2013.01); H05K 3/061 (2013.01); H05K 3/4038 (2013.01); H05K 3/4647 (2013.01); H05K 2203/0597 (2013.01)

(58) Field of Classification Search
CPC ...... H05K 1/114; H05K 1/115; H05K 3/4038; H05K 2201/0391; H05K 2201/0367; H05K 2201/0347; H05K 2201/09436; H05K 2201/09518; H05K 2201/09845; H05K 2201/09454; H05K 2201/09736
USPC .................................. 174/262, 265
See application file for complete search history.

(56) References Cited

U.S. PATENT DOCUMENTS

| | | | |
|---|---|---|---|
| 6,261,941 B1 * | 7/2001 | Li | H05K 3/4647 438/618 |
| 8,686,300 B2 * | 4/2014 | Kawai | H05K 1/113 174/262 |
| 2005/0155792 A1 * | 7/2005 | Ito | H05K 3/4069 174/264 |

(Continued)

FOREIGN PATENT DOCUMENTS

JP 2004-319994 A 11/2004

Primary Examiner — Chau N Nguyen
Assistant Examiner — Roshn Varghese
(74) Attorney, Agent, or Firm — Oblon, McClelland, Maier & Neustadt, L.L.P.

(57) ABSTRACT

A printed wiring board includes a conductor layer including a conductor circuit, a resin insulating layer formed on the conductor layer and having a via opening reaching to the conductor circuit of the conductor layer, and a via conductor formed in the via opening of the resin insulating layer such that the via conductor is connecting to the conductor circuit of the conductor layer. The conductor circuit of the conductor layer has a first conductor portion and a second conductor portion integrally formed such that the first conductor portion is connected to the via opening of the resin insulating layer, that the second conductor portion is surrounding the first conductor portion and that the first conductor portion has a thickness which is greater than a thickness of the second conductor portion.

20 Claims, 6 Drawing Sheets

(56) References Cited

U.S. PATENT DOCUMENTS

| | | | |
|---|---|---|---|
| 2006/0076671 A1* | 4/2006 | Kariya | H01L 23/49811 |
| | | | 174/262 |
| 2007/0148951 A1* | 6/2007 | Pang | H01L 21/2885 |
| | | | 438/614 |
| 2008/0258300 A1* | 10/2008 | Kobayashi | H01L 21/4853 |
| | | | 438/125 |
| 2008/0314633 A1* | 12/2008 | Kang | H05K 3/4007 |
| | | | 174/264 |
| 2010/0065194 A1* | 3/2010 | Nagase | H05K 3/4007 |
| | | | 156/230 |
| 2010/0096744 A1* | 4/2010 | Mori | H01L 21/4853 |
| | | | 174/262 |
| 2010/0139969 A1* | 6/2010 | An | H05K 3/4007 |
| | | | 174/266 |
| 2015/0009645 A1* | 1/2015 | Kaneko | H05K 1/181 |
| | | | 174/261 |

\* cited by examiner

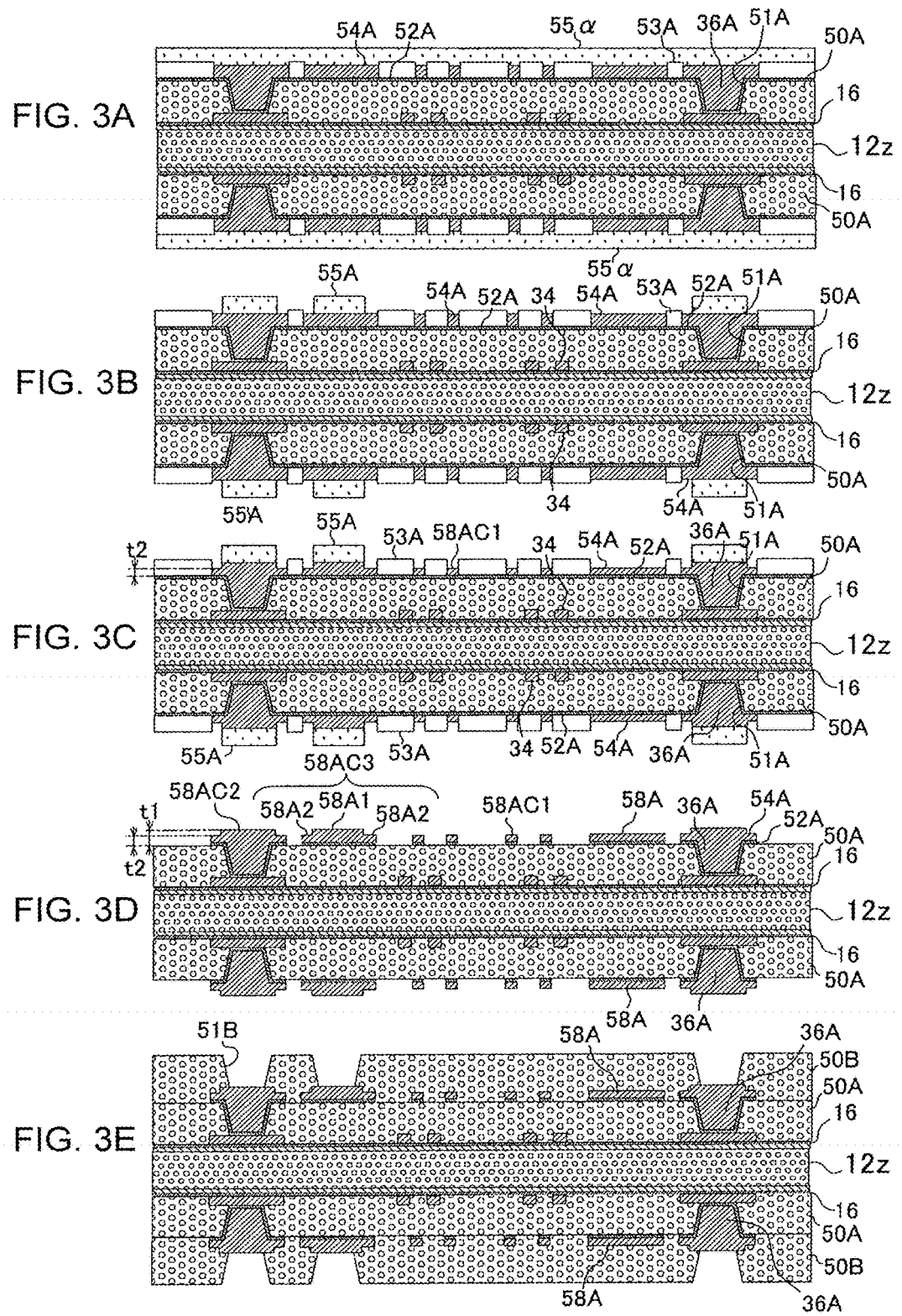

US 10,051,736 B2

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2016-012464, filed Jan. 26, 2016, the entire contents of which are incorporated herein by reference.

BACKGROUND OF THE INVENTION

Field of the Invention

The present invention relates to a printed wiring board having a second conductor circuit that is formed from a first conductor part and a second conductor part, and relates to a method for manufacturing the printed wiring board.

Description of Background Art

Japanese Patent Laid-Open Publication No. 2004-319994 describes a printed wiring board in which a circuit is formed from a copper foil on an interlayer resin insulating layer, and a via hole is formed from electrolytic plating. Further, a position of an upper surface of the circuit on the interlayer resin insulating layer and a position of an upper surface of the via hole are different from each other. The entire contents of this publication are incorporated herein by reference.

SUMMARY OF THE INVENTION

According to one aspect of the present invention, a printed wiring board includes a conductor layer including a conductor circuit, a resin insulating layer formed on the conductor layer and having a via opening reaching to the conductor circuit of the conductor layer, and a via conductor formed in the via opening of the resin insulating layer such that the via conductor is connecting to the conductor circuit of the conductor layer. The conductor circuit of the conductor layer has a first conductor portion and a second conductor portion integrally formed such that the first conductor portion is connected to the via opening of the resin insulating layer, that the second conductor portion is surrounding the first conductor portion and that the first conductor portion has a thickness which is greater than a thickness of the second conductor portion.

According to another aspect of the present invention, a method for manufacturing a printed wiring board includes forming a conductor layer including a conductor circuit, forming a resin insulating layer on the conductor layer such that the resin insulating layer has a via opening reaching to the conductor circuit of the conductor layer, and forming a via conductor in the via opening of the resin insulating layer such that the via conductor connects to the conductor circuit of the conductor layer. The forming of the conductor circuit of the conductor layer includes integrally forming a first conductor portion and a second conductor portion such that the first conductor portion connects to the via opening of the resin insulating layer, that the second conductor portion surrounds the first conductor portion and that the first conductor portion has a thickness which is greater than a thickness of the second conductor part.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3A-3E illustrate manufacturing process diagrams of the printed wiring board of the embodiment;

DETAILED DESCRIPTION OF THE EMBODIMENTS

Figure 1A:
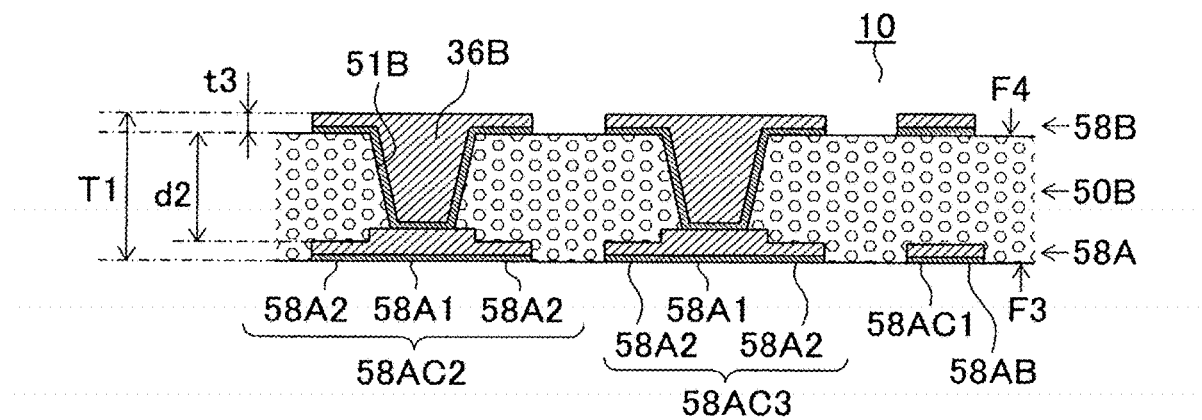
FIG. 1A is a cross-sectional view of a printed wiring board according to a first embodiment of the present invention.

The embodiments will now be described with reference to the accompanying drawings, wherein like reference numerals designate corresponding or identical elements throughout the various drawings.

First Embodiment

FIG. 1A illustrates a cross-sectional view of a printed wiring board 10 of a first embodiment.

As illustrated in FIG. 1A, the printed wiring board 10 includes: a second conductor layer (58A); a second resin insulating layer (50B) that is formed on the second conductor layer (58A); a third conductor layer (58B) that is formed on the second resin insulating layer (50B); and a second via conductor (36B) that penetrates the second resin insulating layer (50B) and connects the second conductor layer (58A) and the third conductor layer (58B). The second conductor layer (58A) has multiple conductor circuits (58AC1, 58AC2, 58AC3). As illustrated in FIG. 1A, the conductor circuits (58AC2, 58AC3) are each formed from a first conductor part (58A1) and a second conductor part (58A2).

Figure 1B:
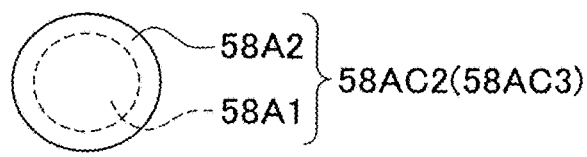
FIG. 1B is a plan view of a second conductor circuit.
Figure 1C:
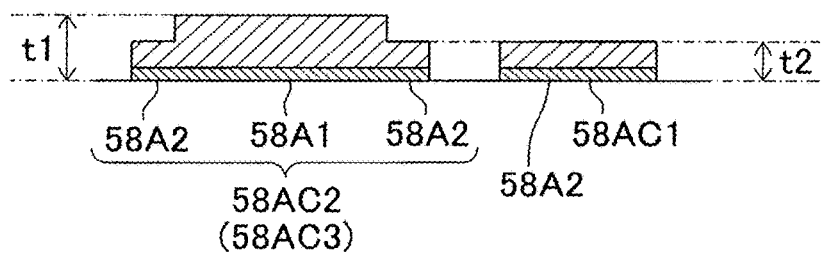
FIG. 1C is a cross-sectional view of a second conductor layer.

As illustrated in FIG. 1A, the second resin insulating layer (50B) has a third surface (F3) and a fourth surface (F4) that is on an opposite side of the third surface (F3). The second resin insulating layer (50B) fills spaces between the conductor circuits (58AC1, 58AC2, 58AC3) that form the second conductor layer (58A). The second resin insulating layer (50B) has an opening (51B) for the second via conductor (36B). The second resin insulating layer (50B) is sandwiched by the second conductor layer (58A) and the third conductor layer (58B). Since the first conductor part (58A1) is connected to the third conductor layer (58B) via the second via conductor (36B), the first conductor part (58A1) does not affect insulation resistance between the third conductor layer (58B) and the second conductor layer (58A). Therefore, a distance (d2) between the second conductor part (58A2) and the third conductor layer (58B) affects insulation reliability between the second conductor layer (58A) and the third conductor layer (58B). Since the second conductor part (58A2) has a small thickness (t2), insulation reliability of the printed wiring board of the embodiment is high. In the embodiment, a thickness (d2) of the second resin insulating layer (50B) is the distance (d2) between the third conductor layer (58B) and the second conductor part (58A2). The thickness (d2) is 4 μm or more and 6 μm or less. As illustrated in FIG. 1C, the thickness (t2) of the second conductor part (58A2) is smaller than a thickness (t1) of the first conductor part (58A1). Therefore, a distance (thickness of the printed wiring board 10 of the first embodiment) (T1) between the third surface (F3) of the second resin insulating layer (50B) and an upper surface of the third conductor layer (58B) is reduced. According to the embodiment, a thin printed wiring board 10 can be provided. When a distance between the first conductor part and the third conductor layer significantly affects the insulation reliability, the distance between the first conductor part and the third conductor layer is increased. The thickness (T1) of the printed wiring board is increased. Therefore, when the via conductor is formed on the first conductor part, the thickness (T1) of the printed wiring board can be reduced.

As illustrated in FIG. 1A, the second conductor layer (58A) is formed on the third surface (F3) side of the second resin insulating layer (50B) and is embedded in the second resin insulating layer (50B). A lower surface (58AB) of the second conductor layer (58A) is exposed from the third surface (F3) of the second resin insulating layer (50B).

FIG. 1C illustrates a cross-sectional view of the conductor circuits (58AC1, 58AC2, 58AC3) in the second conductor layer (58A). FIG. 1B illustrates a plan view of the conductor circuits (58AC2, 58AC3) in the second conductor layer (58A). In FIG. 1B, a boundary between the first conductor part (58A1) and the second conductor part (58A2) is depicted using a dotted line. As illustrated in FIG. 1A or FIG. 1C, the conductor circuit (first conductor circuit in the second conductor layer (58A)) (58AC1) is formed from the second conductor part (58A2) only. As illustrated in FIGS. 1A and 1B, the second conductor circuit (58AC2) in the second conductor layer (58A) and the third conductor circuit (58AC3) in the second conductor layer (58A) are each formed from the first conductor part (58A1) and the second conductor part (58A2) that surrounds the first conductor part (58A1). The first conductor part (58A1) and the second conductor part (58A2) are integrally formed. The first conductor part (58A1) and the second conductor part (58A2) are simultaneously formed. The second conductor part (58A2) directly extends from the entire outer periphery of the first conductor part (58A1). FIG. 1C illustrates an enlarged view of the conductor circuits (58AC1, 58AC2, 58AC3). The thickness (t1) of the first conductor part (58A1) is larger than the thickness (t2) of the second conductor part (58A2). A thickness (t2) of the conductor circuit (58AC1) is substantially equal to the thickness (t2) of the second conductor part (58A2). The thickness (t1) is 3.5 μm or more and 6.5 μm or less. The thickness (t2) is 1 μm or more and 4 μm or less.

As illustrated in FIG. 1A, the second via conductor (36B) penetrates the second resin insulating layer (50B) and is formed in the opening (second opening for the second via conductor) (51B) that reaches the first conductor part (58A1). The second via conductor (36B) is formed directly on the first conductor part (58A1). It is preferable that the second via conductor (36B) be not formed on the second conductor part (58A2). The second via conductor (36B) and the first conductor part (58A1) are directly connected to each other. Due to heat cycles, an interface between the second via conductor (36B) and the second conductor layer (58A) is likely to receive a large stress. However, in the embodiment, the second via conductor (36B) is connected to the first conductor part (58A1) that has a large thickness. Since the thickness of the first conductor part (58A1) is large, the first conductor part (58A1) is unlikely to be deformed by the stress. Therefore, the stress at the interface between the second via conductor (36B) and the first conductor part (58A1) is unlikely to become large. Further, the first conductor part (58A1) is surrounded by the second conductor part (58A2) that has a small thickness. Since the second conductor part (58A2) is thin, the second conductor part (58A2) is likely to deform. Due to the deformation of the second conductor part (58A2), the stress at the interface between the second via conductor (36B) and the first conductor part (58A1) is likely to be relaxed. According to the embodiment, reliability of connection between the second conductor layer and the third conductor layer via the second via conductor (36B) can be increased.

When the opening (51B) is formed using laser, laser may penetrate the second conductor layer (58A). However, in the embodiment, laser reaches the first conductor part (58A1) that has a large thickness. Therefore, in the embodiment, laser is unlikely to penetrate the second conductor layer (58A). Reliability of connection between the second via conductor (36B) and the second conductor layer (58A) can be increased.

The third conductor layer (58B) is formed on the fourth surface (F4) of the second resin insulating layer (50B). In the first embodiment, the third conductor layer (58B) is an uppermost conductor layer, and the second via conductor (36B) is an uppermost via conductor. The third conductor layer (58B) and the second via conductor (36B) are simultaneously formed.

Examples of the thicknesses (t1, t2) and the thickness (d2) are as follows. The thickness (t2) is 2.5 μm. The thickness (t1) is 5 μm. A thickness of the second conductor layer (58A) can be considered as being equal to the thickness (t1). The thickness (d2) is 5 μm. The thickness (T1) of the printed wiring board 10 is 10 μm. An insulation distance between the second conductor layer (58A) and the third conductor layer (58B) is substantially equal to the thickness (d2).

Second Embodiment

Figure 1D:
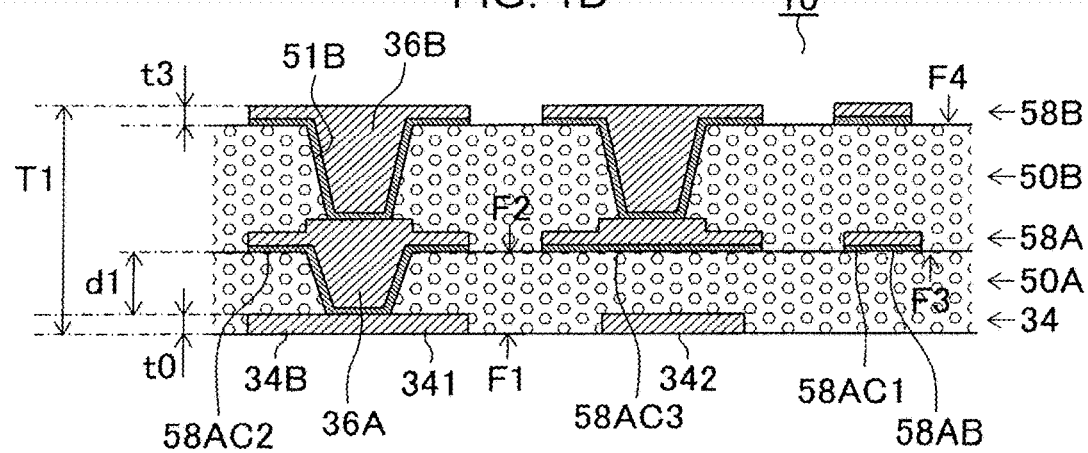
FIG. 1D is a cross-sectional view of a printed wiring board according to a second embodiment.

A printed wiring board 10 of a second embodiment is illustrated in FIG. 1D. The printed wiring board 10 of the second embodiment includes a first resin insulating layer (50A) that is formed below the second conductor layer (58A) and the second resin insulating layer (50B) of the printed wiring board 10 of the first embodiment, a first conductor layer 34 that is formed below the first resin insulating layer, and a first via conductor (36A) that penetrates the first resin insulating layer (50A) and connects the first conductor layer 34 and the second conductor layer (58A). The first resin insulating layer (50A) has a first surface (F1) and a second surface (F2) that is on an opposite side of the first surface (F1). The second surface (F2) and the third surface (F3) oppose each other. The second conductor layer (58A) and the second resin insulating layer (50B) are formed on the second surface (F2). The first conductor layer 34 is embedded in the first resin insulating layer (50A). A bottom (34B) of the first conductor layer 34 is exposed from the first surface (F1) of the first resin insulating layer (50A).

The first resin insulating layer (50A) fills in between conductor circuits (341, 342) that are formed in the first conductor layer 34. The first conductor layer 34 has the multiple conductor circuits (341, 342). The second conductor layer (58A) has the conductor circuits (58AC1, 58AC2, 58AC3) similar to the first embodiment. The thickness (t2) of the conductor circuit (58AC1) and the thickness (t1) of the conductor circuits (58AC2, 58AC3) are different from each other. When a conductor circuit is formed from a thin conductor and a thick conductor, a thickness of the conductor circuit is represented by the thickness of the thick conductor. The second conductor layer (58A) is formed from conductors having different thicknesses. In contrast, thicknesses (t0) of the conductor circuits (341, 342) that form the first conductor layer 34 are substantially equal to each other. Therefore, flatness of the second surface (F2) of the first resin insulating layer (50A) that is formed on the first conductor layer 34 can be increased. As a result, the thickness (t2) of the conductor circuit (58AC1) and the thickness (t1) of the conductor circuits (58AC2, 58AC3) can be controlled with high accuracy.

Figure 6A:
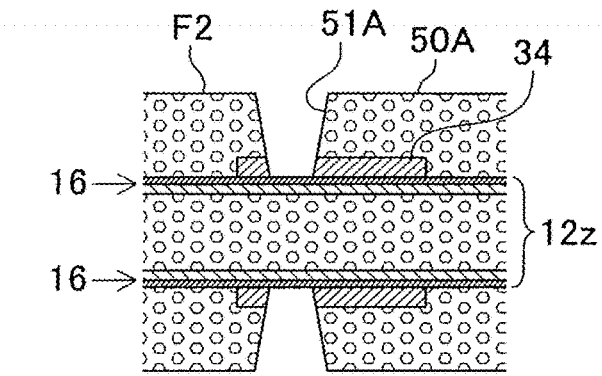
FIG. 6A-6C are manufacturing process diagrams of a printed wiring board of an embodiment.
Figure 6B:
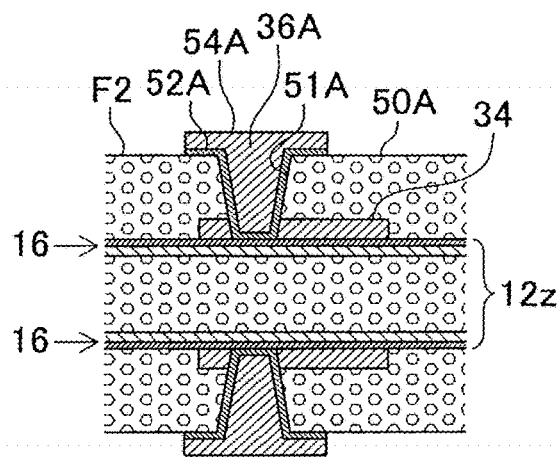
Figure 6C:
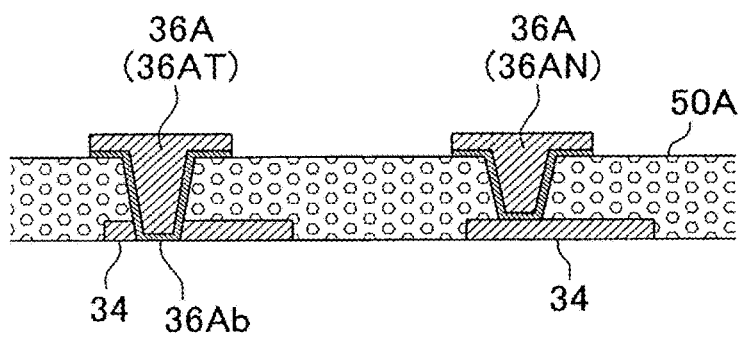
Figure 6D:
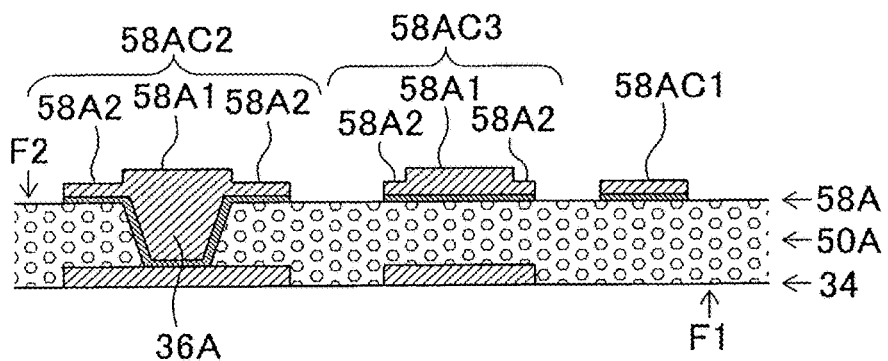
FIG. 6D illustrates a portion of FIG. 1A.

FIG. 6D illustrates a portion of the printed wiring board of FIG. 1D.

FIG. 6D is obtained by omitting the second resin insulating layer (50B), the third conductor layer (58B) and the second via conductor (36B) from the printed wiring board of FIG. 1D. The second conductor circuit (58AC2) forms a land of the first via conductors (36A) that is directly connected to the first via conductor (36A). The first via conductor (36A) and the second conductor circuit (58C2) are simultaneously formed. The first conductor part (58A1) that forms the second conductor circuit (58AC2) is directly formed on the first via conductor. The second conductor part (58A2) that forms the second conductor circuit (58AC2) is formed on the second surface (F2) of the first resin insulating layer (50A). The second conductor part (58A2) that forms the second conductor circuit (58AC2) is formed on the first resin insulating layer surrounding the first via conductor (36A). The third conductor circuit (58AC3) that forms the second conductor layer (58A) is formed on the second surface (F2) of the first resin insulating layer (50A). The first conductor part (58A1) and the second conductor part (58A2) that form the third conductor circuit (58AC3) are both formed on the second surface (F2) of the first resin insulating layer (50A).

Examples of the thickness (t0) of the first conductor layer 34 and the thickness (d1) of the first resin insulating layer (50A) are as follows. The thickness (d1) is a distance between the first conductor layer 34 and the second conductor layer (58A). The thicknesses (t1, t2) of the conductor circuits (58AC1, 58AC2, 58AC3) in the second conductor layer (58A) and the thickness (d2) of the second resin insulating layer (50B) are the same as those in the first embodiment. The thickness (t0) is 3.5 μm or more and 6.5 μm or less. For example, the thickness (t0) is 5 μm. Even when an opening (51A) for the via conductor (36A) reaching the first conductor layer 34 is formed using laser, laser is unlikely to penetrate the first conductor layer 34. The thickness (t0) is 1 μm or more and 4 μm or less. For example, the thickness (t0) is 2.5 μm. Since the thickness (t0) is small, the thickness (T1) of the printed wiring board 10 can be reduced. The thickness (d1) is 3.5 μm or more and 6.5 μm or less. For example, the thickness (d1) is 5 μm.

Third Embodiment

Figure 5A:
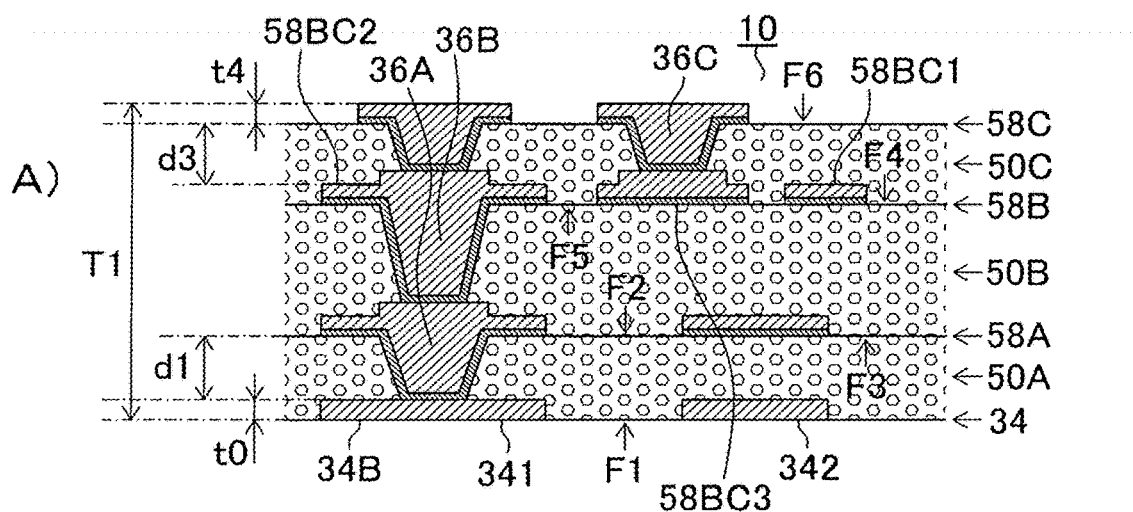
FIG. 5A is a cross-sectional view of a printed wiring board according to a third embodiment.
Figure 5B:
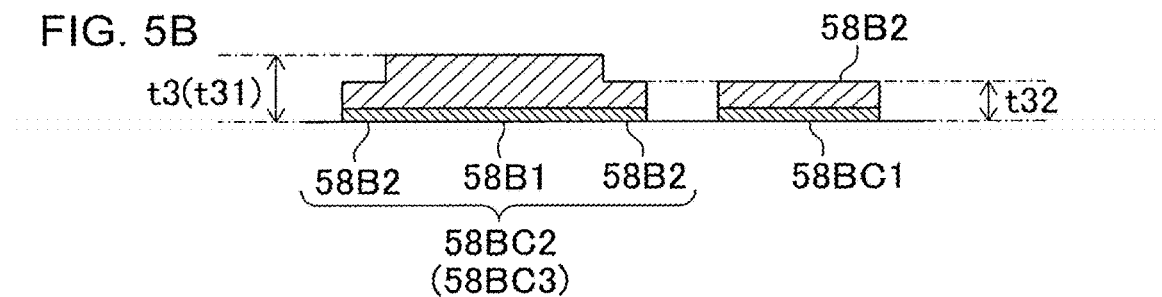
FIG. 5B is a cross-sectional view of a third conductor layer.
Figure 5C:
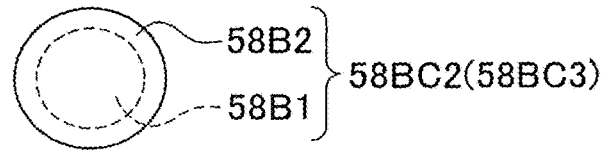
FIG. 5C is a plan view of a second conductor circuit.

A printed wiring board 10 of a third embodiment is illustrated in FIG. 5A. The printed wiring board 10 of the third embodiment includes a third resin insulating layer (50C) that is formed on the third conductor layer (58B) and on the fourth surface (F4) of the second resin insulating layer (50B) of the printed wiring board 10 of the second embodiment, a fourth conductor layer (58C) that is formed on the third resin insulating layer (50C), and a third via conductor (36C) that penetrates the third resin insulating layer (50C) and connects the third conductor layer (58B) and the fourth conductor layer (58C). The third resin insulating layer (50C) has a fifth surface (F5) and a sixth surface (F6) that is on an opposite side of the fifth surface (F5). The fifth surface (F5) and the fourth surface (F4) oppose each other. The third conductor layer (58B) and the third resin insulating layer (50C) are formed on the fourth surface (F4). In the first embodiment and the second embodiment, thicknesses (t3) of conductor circuits that form the third conductor layer (58B) are substantially equal to each other. Similar to the first conductor layer 34 of the second embodiment, the conductor circuits that form the third conductor layer (58B) of the first embodiment or the second embodiment are not each formed from a thick conductor and a thin conductor. In contrast, similar to the second conductor layer (58A) of the first embodiment, the third conductor layer (58B) of the third embodiment is formed from a thick conductor and a thin conductor. The third conductor layer (58B) is formed from multiple conductor circuits (58BC1, 58BC2, 58BC3). Examples of the conductor circuits (58BC1, 58BC2, 58BC3) are illustrated in FIGS. 5B and 5C. FIG. 5B is a cross-sectional view. FIG. 5C is a plan view. The conductor circuits (58BC2, 58BC3) are each formed from a first conductor part (58B1) and a second conductor part (58B2). In FIG. 5C, a boundary between the first conductor part (58B1) and the second conductor part (58B2) is depicted using a dotted line. As illustrated in FIG. 5B, the conductor circuit (first conductor circuit in the third conductor layer (58B)) (58BC1) is formed from the second conductor part (58B2) only. As illustrated in FIGS. 5A and 5B, the second conductor circuit (58BC2) in the third conductor layer (58B) and the third conductor circuit (58BC3) in the third conductor layer (58B) are each formed from the first conductor part (58B1) and the second conductor part (58B2) that surrounds the first conductor part (58B1). The first conductor part (58B1) and the second conductor part (58B2) are integrally formed. The first conductor part (58B1) and the second conductor part (58B2) are simultaneously formed. The second conductor part (58B2) directly extends from the entire outer periphery of the first conductor part (58B1). FIG. 5B illustrates an enlarged view of the conductor circuits (58BC1, 58BC2, 58BC3). A thickness (t31) of the first conductor part (58B1) is larger than a thickness (t32) of the second conductor part (58B2). A thickness (t32) of the conductor circuit (58BC1) is substantially equal to the thickness of the second conductor part (58B2). The thickness (t31) is 3.5 μm or more and 6.5 μm or less. The thickness (t32) is 1 μm or more and 4 μm or less. An example of the thickness (t31) is 5 μm. An example of thickness (t32) is 2.5 μm. The thickness (t3) of the third conductor layer (58B) is represented by the thickness (t31). The third via conductor (36C) reaches the first conductor part (58B1) of the conductor circuits (58BC2, 58BC3). Even when an opening for the third via conductor (36C) is formed using laser, since the thickness (t31) of the first conductor part (58B1) is large, laser is unlikely to penetrate the third conductor layer (58B). Similar to the second conductor circuit (58AC2) of the second conductor layer (58A), the second conductor circuit (58BC2) of the third conductor layer (58B) is a land of the second via conductor (36B).

Similar to the third conductor circuit (58AC3) of the second conductor layer (58A), the third conductor circuit (58BC3) of the third conductor layer (58B) is formed on the second resin insulating layer (50B).

Thicknesses (t4) of conductor circuits that form the fourth conductor layer (58C) are substantially equal to each other. The conductor circuits that form the fourth conductor layer (58C) of the third embodiment are not each formed from a thick conductor and a thin conductor. The conductor circuits that form the fourth conductor layer (58C) are each formed from a second conductor part.

Examples of the thickness (t4) of the fourth conductor layer (58C) and a thickness (d3) of the third resin insulating layer (50C) are as follows. The thickness (d3) is a distance between the third conductor layer (58B) and the fourth conductor layer (58C). The thickness (t4) is 1 µm or more and 4 µm or less. For example, the thickness (t4) is 2.5 µm. The thickness (d3) is 3.5 µm or more and 6.5 µm or less. For example, the thickness (d3) is 5 µm.

Fourth Embodiment

The third resin insulating layer (50C) of the third embodiment can be formed on the third conductor layer (58B) and the fourth surface (F4) of the second resin insulating layer (50B) of the printed wiring board 10 of the first embodiment. Further, the fourth conductor layer (58C) can be formed on the third resin insulating layer (50C). Then, in order to connect the third conductor layer (58B) and the fourth conductor layer (58C), the third via conductor (36C) can be formed in the third resin insulating layer (50C). As a result, a printed wiring board of a fourth embodiment is obtained. The third conductor layer (58B) of the printed wiring board of the fourth embodiment and the third conductor layer (58B) of the printed wiring board of the third embodiment are the same. The fourth conductor layer (58C) of the printed wiring board of the fourth embodiment and the fourth conductor layer (58C) of the printed wiring board of the third embodiment are the same. The third resin insulating layer (50C) of the printed wiring board of the fourth embodiment and the third resin insulating layer (50C) of the printed wiring board of the third embodiment are the same.

Figure 5D:
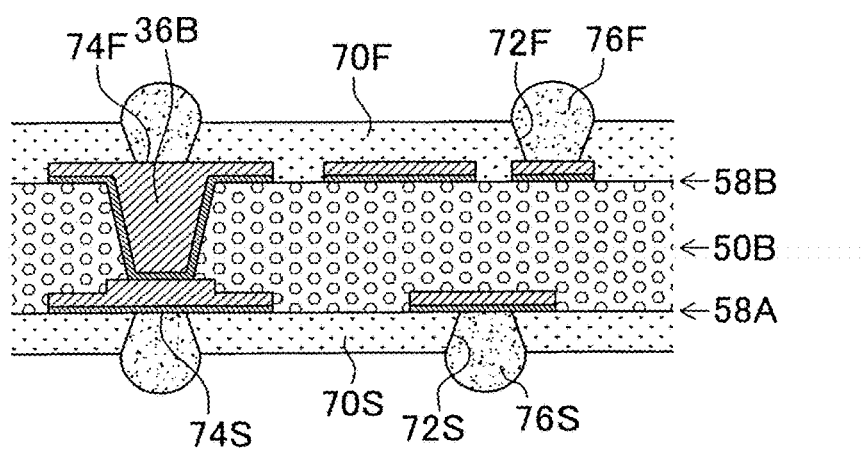
FIG. 5D is a cross-sectional view of a printed wiring board having a solder resist layer and a solder bump.

A first solder resist layer can be formed on an uppermost resin insulating layer and an uppermost conductor layer of the printed wiring board 10 of each of the embodiments. In FIGS. 1A and 1D, the uppermost resin insulating layer is the second resin insulating layer (50B), and the uppermost conductor layer is the third conductor layer (58B). In FIG. 5A, the uppermost resin insulating layer is the third resin insulating layer (50C), and the uppermost conductor layer is the fourth conductor layer (58C). The uppermost conductor layer protrudes from the uppermost resin insulating layer. The first solder resist layer has an opening that exposes the uppermost conductor layer. A first pad is exposed by the opening of the first solder resist layer. A solder bump can be formed on the first pad. An example of a printed wiring board that has a first solder resist layer (70F) and a solder bump (76F) is illustrated in FIG. 5D. In FIG. 5D, the first solder resist layer (70F) that has an opening (72F) and the solder bump (76F) that is formed on a first pad (74F) are added to the printed wiring board of FIG. 1A. An electronic component such as an IC chip can be mounted on the printed wiring board 10 via the solder bump (76F).

A printed wiring board according to an embodiment of the present invention has a lowermost conductor layer and a lowermost resin insulating layer. The lowermost conductor layer is embedded in the lowermost resin insulating layer. In FIG. 1A, the lowermost conductor layer is the second conductor layer (58A), and the lowermost resin insulating layer is the second resin insulating layer (50B). In FIG. 1A, since there is one resin insulating layer, the second resin insulating layer (50B) is both the lowermost resin insulating layer and the uppermost resin insulating layer. In FIGS. 1D and 5A, the lowermost conductor layer is the first conductor layer 34, and the lowermost resin insulating layer is the first resin insulating layer (50A).

A second solder resist layer can be formed below the lowermost resin insulating layer and the lowermost conductor layer of a printed wiring board 10 according to an embodiment of the present invention. The second solder resist layer has an opening that exposes the lowermost conductor layer. A second pad is exposed by the opening of the second solder resist layer. A solder bump can be formed below the second pad. An example of a printed wiring board that has a second solder resist layer (70S) and a solder bump (76S) is illustrated in FIG. 5D. In FIG. 5D, the second solder resist layer (70S) that has an opening (72S) and the solder bump (76S) that is formed on a second pad (74S) are added to the printed wiring board of FIG. 1A. The printed wiring board of the embodiment is mounted on another circuit substrate via the solder bump (76S).

Figure 5E:
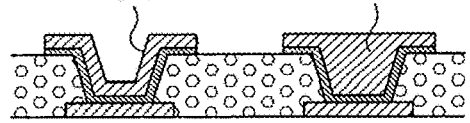
FIG. 5E is a cross-sectional view of a conformal via and a filled via.

A via conductor is a via conductor (conformal via) that is formed along an inner wall of an opening for a via conductor. Or, a via conductor is a via conductor (filled via) that formed by filling an opening for a via conductor. A conformal via (CV) is illustrated on a left side in FIG. 5E. A filled via (FV) is illustrated on a right side in FIG. 5E. It is preferable that a via conductor (uppermost via conductor) that connects to the uppermost conductor layer be a conformal via. The uppermost conductor layer is exposed to outside. Or, the first solder resist layer (70F) is formed on the uppermost conductor layer.

When the printed wiring board 10 has three or more conductor layers, it is preferable that conductor circuits that form each of the uppermost conductor layer and the lowermost conductor layer have the same thickness. In this case, all of the conductor circuits are each formed from the second conductor part. Then, it is preferable that a conductor layer other than the uppermost conductor layer and the lowermost conductor layer include a conductor circuit that is formed from the first conductor part and the second conductor part illustrated in FIG. 1C. The printed wiring board illustrated in FIG. 1D has the three conductor layers (34, 58A, 58B). The first conductor layer 34 is the lowermost conductor layer, and the conductor layer (58B) is the uppermost conductor layer. In FIG. 1D, only the second conductor layer (58A) includes a conductor circuit that is formed from the first conductor part and the second conductor part.

Method for Manufacturing Printed Wiring Board

Figure 2A:
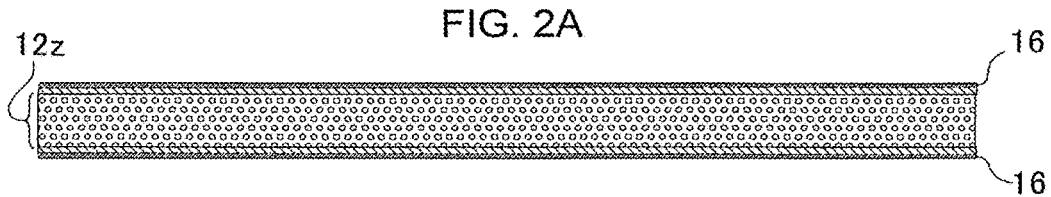
FIG. 2A-2E are manufacturing process diagrams of a printed wiring board of an embodiment.

FIG. 2A-4C illustrate a method for manufacturing the printed wiring boards 10 according to an embodiment of the present invention. As illustrated in FIG. 2A, a support plate (12z) is prepared. An example of the support plate (12z) is a double-sided copper-clad laminated plate. A copper foil 16 is laminated on the support plate (12z) (FIG. 2A). A plating resist is formed on the copper foil 16. An electrolytic copper plating film 24 is formed by electrolytic copper plating on the copper foil 16 exposed from the plating resist. The plating resist is removed. The first conductor layer 34 is formed from the electrolytic copper plating film 24 (FIG. 2B). The thickness (t0) of the first conductor layer 34 is 2.5 µm. The first resin insulating layer (50A) is formed on the first conductor layer 34 and the copper foil 16 (FIG. 2C). The first conductor layer 34 is embedded on the first surface (F1) side of the first resin insulating layer (50A).

Figure 2B:
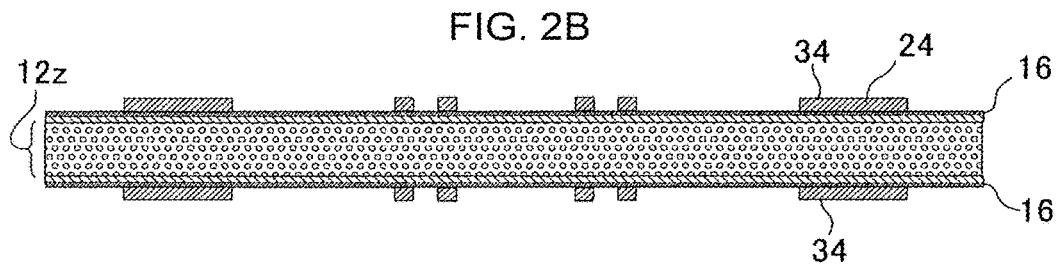
Figure 2C:
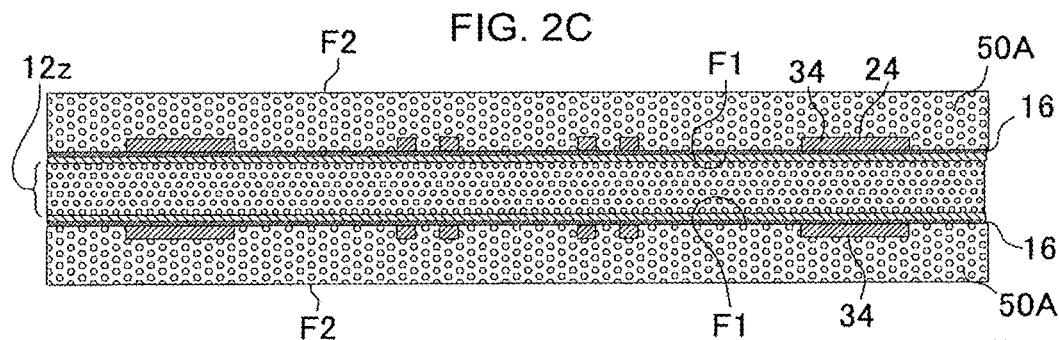
Figure 2D:
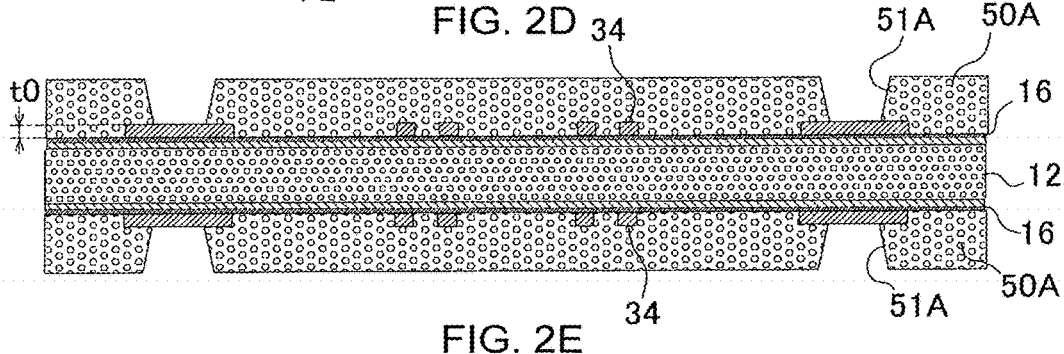
Figure 2E:
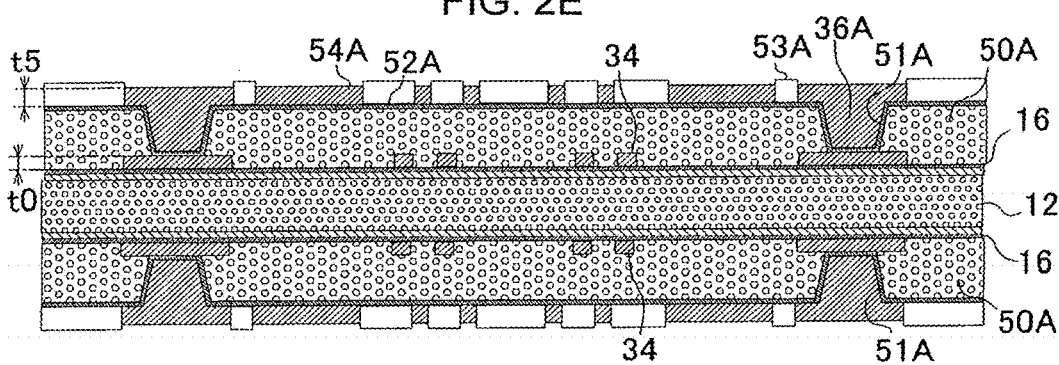

The opening (51A) for the first via conductor that reaches the first conductor layer 34 is formed in the first resin insulating layer (50A) using laser (FIG. 2D). The thickness (t0) is small. However, the first conductor layer 34 is formed on the copper foil 16. Therefore, heat generated by laser is transmitted from the first conductor layer 34 to the copper foil 16. Therefore, laser is unlikely to penetrate the first conductor layer 34. An electroless plating film (52A) is formed on the second surface (F2) of the first resin insulating layer (50A) and in the opening (51A). Thereafter, a plating resist (53A) is formed on the electroless plating film (52A). An electrolytic plating film (54A) is formed on the electroless plating film (52A) that is exposed from the plating resist (53A). The opening (51A) is filled with the electrolytic plating, and a filled via (36A) is formed (FIG. 2E). The plating film (electrolytic plating film) (54A) for forming the second conductor layer (58A) and the filled via that forms the first via conductor (36A) are simultaneously formed. A sum (t5) of a thickness of the electroless plating film (52A) and a thickness of the electrolytic plating film (54A) is about 5 μm.

An etching resist composition (55α) is applied on the plating resist (53A) and the electrolytic plating film (plating film) (54A) (FIG. 3A). In order to form the first conductor circuit (58AC1) in the second conductor layer (58A), the second conductor circuit (58AC2) in the second conductor layer (58A) and the third conductor circuit (58AC3) in the second conductor layer from the plating film (54A), an etching resist (55A) is formed on the plating film (54A) exposed from the plating resist (53A) (FIG. 3B). The etching resist (55A) is formed from the etching resist composition (55α) using a photographic technology. A position at which the etching resist (55A) is formed is on the first conductor part (58A1). By partially thinning the plating film (54A), the second conductor part (58A2) and the first conductor circuit (58AC1) are formed. When the second conductor layer (58A) is formed from the plating film (54A), the second conductor part (58A2) and the first conductor circuit (58AC1) are formed by thinning the plating film (54A). Therefore, the etching resist (55A) is not formed on the plating film (54A) for forming the second conductor part (58A2) and the first conductor circuit (58AC1). The plating film (54A) that changes to the second conductor part (58A2) and the first conductor circuit (58AC1) is exposed from the etching resist (55A). As illustrated in FIG. 3C, the thickness of the plating film (54A) exposed from the etching resist (55A) is reduced. The thickness (t2) of the electroless plating film (52A) and the electrolytic plating film (54A) is adjusted to 2.5 μm. The first conductor part (58A1) that forms the land (58AC2) of the first via conductor (36A) is formed from the plating film (54A) only. Further, the second conductor part (58A2) that forms the land (58AC2) of the first via conductor (36A) is formed from the seed layer (52A) and the plating film (54A) on the seed layer (52A). The first conductor part (58A1) and the second conductor part (58A2) that form the third conductor circuit (58AC3) are formed from the seed layer (52A) and the plating film (54A) on the seed layer.

Since the second conductor layer (58A) is formed from the plating film (54A), the land (58AC2) of the first via conductor (36A) and the first via conductor (36A) are simultaneously formed. The land (58AC2) and the first via conductor (36A) are integrally formed.

The etching resist 55A) is removed. The plating resist (53A) is removed. The plating resist (53A) and the etching resist (55A) are simultaneously removed. The electroless plating film (52A) exposed from the plating film (54A) is removed. The second conductor layer (58A) is formed (FIG. 3D). The thickness (t2) of the first conductor circuit (58AC1) is 2.5 μm. the thickness (t1) of the second conductor circuit (58AC2) and the third conductor circuit (58AC3) is 5 μm.

Figure 4A:
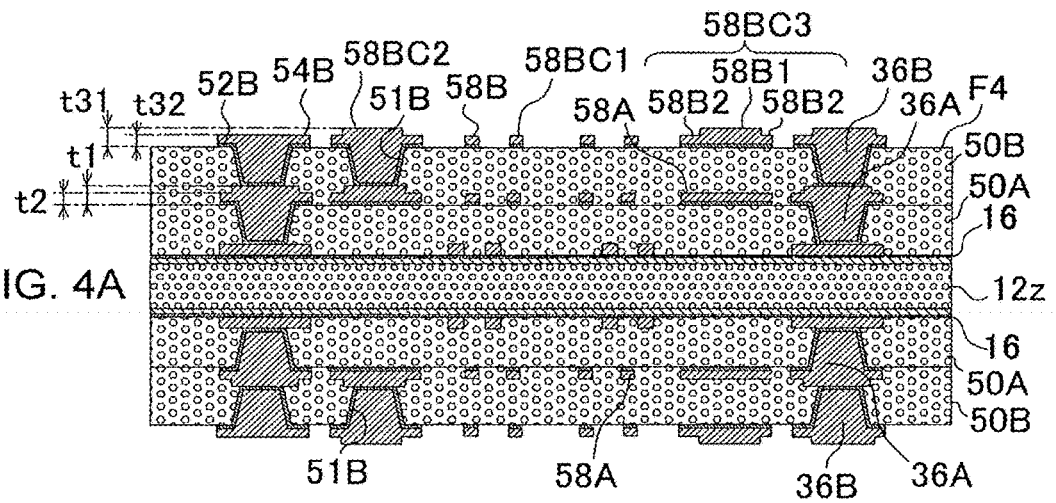
FIG. 4A-4C are manufacturing process diagrams of the printed wiring board of the embodiment.

The second resin insulating layer (50B) is formed on the first resin insulating layer (50A) and the second conductor layer (58A). The opening (51B) for the second via conductor (36B) reaching the second conductor layer (58A) is formed in the second resin insulating layer (50B) (FIG. 3E). The opening (51B) reaches the first conductor part (58A1). The thickness (t1) of the first conductor part (58A1) is 5 μm. Since the thickness of the first conductor part (58A1) is large, laser is unlikely to penetrate the first conductor part (58A1). The same processes as those illustrated in FIG. 2E-3D are performed. The third conductor layer (58B) illustrated in FIG. 5B is formed on the fourth surface (F4) of the second resin insulating layer (50B) (FIG. 4A). The third conductor layer (58B) has the first conductor circuit (58BC1) in the third conductor layer (58B), the second conductor circuit (58BC2) in the third conductor layer (58B), and the third conductor circuit (58BC3) in the third conductor layer (58B). The second via conductor (36B) that connects the second conductor layer (58A) and the third conductor layer (58B) is formed in the second resin insulating layer (50B) (FIG. 4A). The thickness (t32) of the first conductor circuit (58BC1) is 2.5 μm. The thickness (t31) of the conductor circuits (58BC2, 58BC3) that each have the first conductor part (58B1) and the second conductor part (58B2) is 5 μm. The thickness (t31) of the first conductor part (58B1) is 5 μm. The thickness (t32) of the second conductor part (58B2) is 2.5 μm.

Figure 4B:
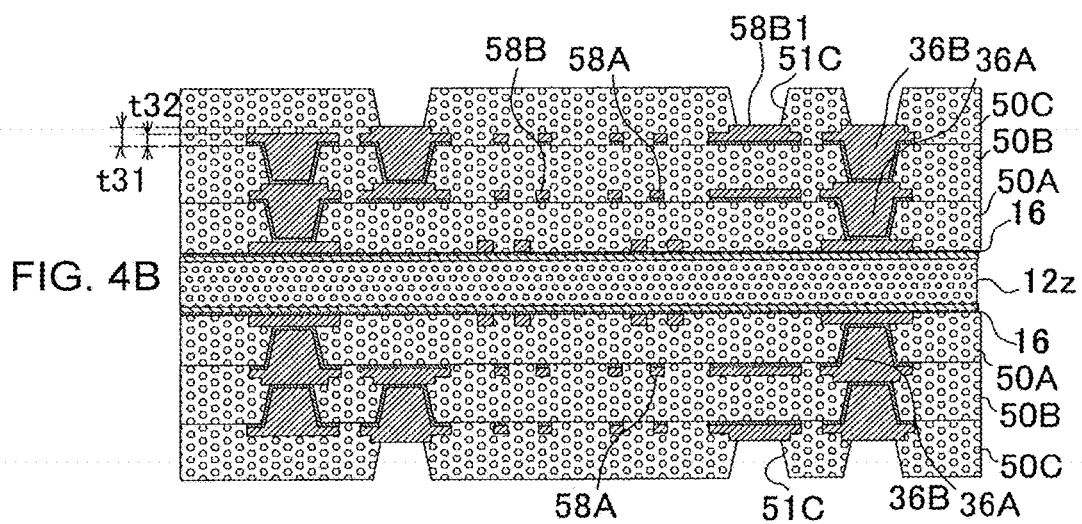
Figure 4C:
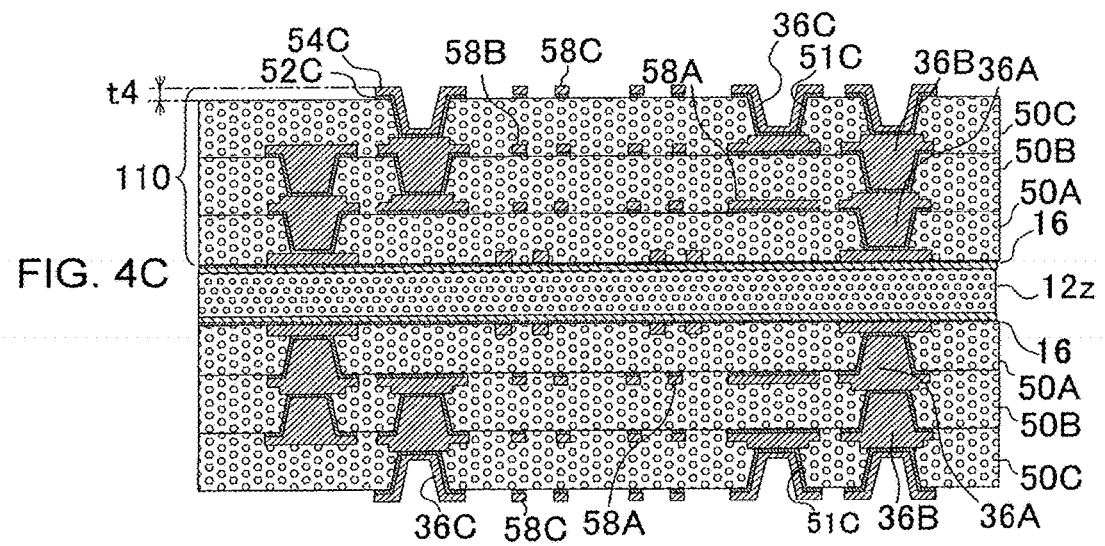

The third resin insulating layer (50C) is formed on the second resin insulating layer (50B) and the third conductor layer (58B). An opening (51C) for the third via conductor (36C) reaching the first conductor part (58B1) is formed in the third resin insulating layer (50C) using laser (FIG. 4B). In this case, similar to the process illustrated in FIG. 3E, the opening (51C) reaches the first conductor part (58B1). Therefore, laser is unlikely to penetrate the third conductor layer (58B). The fourth conductor layer (58C) and the third via conductor (36C) are formed from an electroless plating film (52C) and an electrolytic plating film (54C) using a semi-additive method (FIG. 4C). The fourth conductor layer (58C) is formed from the second conductor part only. The thickness (t4) of the fourth conductor layer (58C) is 2.5 μm. The third via conductor (36C) is a conformal via (CV). An intermediate substrate 110 including the printed wiring board 10 of the third embodiment and the copper foil 16 is formed on the support plate (12z) (FIG. 4C).

The intermediate substrate 110 is separated from the support plate (12z). The copper foil 16 is removed from the intermediate substrate 110, and the printed wiring board 10 of the third embodiment is formed (FIG. 5A).

In FIG. 4A, the third conductor layer (58B) can be formed from the second conductor part only. An intermediate substrate 110 including the printed wiring board 10 of the second embodiment and the copper foil 16 is formed on the support plate (12z). The intermediate substrate 110 and the support plate are separated from each other. The copper foil 16 is removed from the intermediate substrate 110. The printed wiring board of the second embodiment is formed (FIG. 1D).

In the process of FIG. 2B, a plating resist is formed on a surface formed by an upper surface of the copper foil 16.

Thereafter, the plating film (electrolytic copper plating film) 24 is formed on the copper foil exposed from the plating resist. The same processes as those illustrated in FIG. 3A-3D are performed. The second conductor layer (58A) including the first conductor circuit (58AC1), the second conductor circuit (58AC2) and the third conductor circuit (58AC3) is formed on the copper foil 16. The second conductor circuit (58AC2) and the third conductor circuit (58AC3) are each formed from the first conductor part (58A1) and the second conductor part (58A2). Thereafter, the second resin insulating layer (50B) is formed on the copper foil 16 and the second conductor layer (58A). The same processes as those illustrated in FIGS. 3E and 4A are performed. An intermediate substrate 110 including the printed wiring board 10 of the first embodiment and the copper foil 16 is formed on the support plate (12z). The intermediate substrate 110 and the support plate are separated from each other. The copper foil 16 is removed from the intermediate substrate 110. The printed wiring board 10 of the first embodiment is formed (FIG. 1A).

In the process of FIG. 2D, even when laser penetrates the first conductor layer 34, laser stops at the copper foil 16. An example of this case is illustrated in FIG. 6A. The opening (51A) illustrated in FIG. 6A penetrates the first resin insulating layer (50A) and the first conductor layer 34. The seed layer (52A) such as an electroless copper plating film is formed on the second surface (F2) of the first resin insulating layer (50A) and in the opening (51A) for the first via conductor. As illustrated in FIG. 6B, even when the opening (51A) penetrates the first conductor layer 34, the opening (51A) is closed by the copper foil 16. Since the seed layer (52A) is formed on the copper foil 16 that is exposed by the opening (51A), a bottom of the opening (51A) is closed by the seed layer (52A). The bottom of the opening (51A) is positioned on the copper foil 16. Thereafter, a plating resist is formed on the seed layer (52A). An electrolytic plating film (54A) is formed from copper or the like on the seed layer exposed from the plating resist. The opening (51A) for the first via conductor is filled with the electrolytic plating film (54A). The first via conductor (36A) is formed from a filled via in the opening (51A) (FIG. 2E). As illustrated in FIG. 6B, even when the opening (51A) penetrates the first conductor layer 34, since the bottom of the opening (51A) is closed by the seed layer (52A), the first via conductor can be formed from the seed layer (52A) and the electrolytic plating film (54A) in the opening (51A) (FIG. 6C). As illustrated in FIG. 6C, the printed wiring board 10 may have both a first via conductor (36AN) that reaches the first conductor layer 34 and a first via conductor (36AT) that penetrates the first conductor layer 34. Or, all first via conductors (36A) may be formed as first via conductors (36AT) that penetrate the first conductor layer 34. In the case of a first via conductor (36AT), a bottom (36Ab) of the via conductor (36A) is exposed. When the printed wiring board 10 has the first via conductor (36AT), data, power and the like are directly transmitted from a circuit substrate, an electronic component, or the like to the first via conductor (36AT). Or, data, power and the like are directly transmitted from the first via conductor (36AT) to a circuit substrate, an electronic component, or the like. Transmission loss is reduced.

The thicknesses of the first conductor parts (58A1, 58B1) that form the conductor circuits are larger than the thicknesses of the second conductor parts (58A2, 58B2).

Japanese Patent Laid-Open Publication No. 2004-319994 describes a printed wiring board in which a circuit is formed from a copper foil on an interlayer resin insulating layer, and a via hole is formed from electrolytic plating. Further, a position of an upper surface of the circuit on the interlayer resin insulating layer and a position of an upper surface of the via hole are different from each other.

In Japanese Patent Laid-Open Publication No. 2004-319994, there exists a bonding interface between the via hole and the circuit. Therefore, due to heat cycles or the like, reliability of connection between the via hole and the circuit is expected to decrease. Further, since the circuit on the interlayer resin insulating layer is formed from a copper foil, it is likely to be difficult to reduce a thickness of the circuit. When the thickness of the circuit is large, a thickness of the printed wiring board is expected to increase. With the technology of Japanese Patent Laid-Open Publication No. 2004-319994, when the thickness of the circuit on the interlayer resin insulating layer is reduced, reliability of connection between the circuit and a via conductor reaching the circuit is likely to decrease.

A printed wiring board according to an embodiment of the present invention includes: a second conductor layer having a conductor circuit that is formed from a first conductor part and a second conductor part that surrounds the first conductor part and is integrally formed with the first conductor part; a second resin insulating layer that is formed on the second conductor layer, and has a second opening for a second via conductor reaching the first conductor part; a third conductor layer that is formed on the second resin insulating layer; and a second via conductor that is formed in the second opening and connects the second conductor layer and the third conductor layer. And, a thickness of the first conductor part is larger than a thickness of the second conductor part.

A method for manufacturing a printed wiring board according to an embodiment of the present invention includes: forming, on a surface, a plating resist for forming a second conductor circuit; forming a plating film on the surface exposed from the plating resist; forming an etching resist on the plating film exposed from the plating resist; forming the second conductor circuit that includes a first conductor part and a second conductor part by thinning the plating film exposed from the etching resist, the second conductor part having a thickness smaller than a thickness of the first conductor part; removing the etching resist; removing the plating resist; forming a second resin insulating layer on the surface and on the second conductor circuit; forming an opening for a second via conductor that penetrates the second resin insulating layer and reaches the first conductor part; forming a third conductor layer on the second resin insulating layer; and forming, in the opening for the second via conductor, the second via conductor that connects the second conductor circuit and the third conductor layer.

According to an embodiment of the present invention, reliability of connection between the second conductor layer and the third conductor layer via the second via conductor can be increased. A thickness of the printed wiring board can be reduced.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a first conductor layer;
a first resin insulating layer formed on the first conductor layer;
a second conductor layer formed on the first resin insulating layer and including a conductor circuit;

a second resin insulating layer formed on the second conductor layer and having a via opening reaching to the conductor circuit of the second conductor layer;

a first via conductor formed through the first resin insulating layer such that the first via conductor is connecting the first conductor layer and the second conductor layer and that the conductor circuit of the second conductor layer is forming a land of the first via conductor; and a second via conductor formed in the via opening of the second resin insulating layer such that the second via conductor is connecting to the conductor circuit of the second conductor layer, wherein the conductor circuit of the second conductor layer comprises a first conductor portion and a second conductor portion integrally formed such that the first conductor portion is connected to the via opening of the second resin insulating layer, that the second conductor portion is surrounding the first conductor portion and that the first conductor portion has a thickness which is greater than a thickness of the second conductor portion, the conductor circuit in the second conductor layer is formed such that the first conductor portion of the conductor circuit is formed on the first via conductor, that the second conductor portion of the conductor circuit is formed on the first resin insulating layer, that the first conductor portion is consisting of an electrolytic plating film and that the second conductor portion comprises a seed layer and an electrolytic plating film formed on the seed layer.

2. A printed wiring board according to claim 1, further comprising:

a third conductor layer formed on the second resin insulating layer, wherein the second via conductor is formed such that the second via conductor is connecting the second conductor layer and the third conductor layer.

3. A printed wiring board according to claim 2, wherein the conductor circuit in the second conductor layer is formed such that the first conductor portion of the conductor circuit has the thickness in a range of from 3.5 μm to 6.5 μm and that the second conductor portion of the conductor circuit has the thickness in a range of from 1 μm to 4 μm.

4. A printed wiring board according to claim 1, wherein the conductor circuit in the second conductor layer is formed such that the first conductor portion of the conductor circuit has the thickness in a range of from 3.5 μm to 6.5 μm and that the second conductor portion of the conductor circuit has the thickness in a range of from 1 μm to 4 μm.

5. A printed wiring board according to claim 1, wherein the conductor circuit in the second conductor layer is formed such that the first conductor portion of the conductor circuit has a substantially flat upper surface facing the via opening.

6. A printed wiring board according to claim 5, wherein the conductor circuit in the second conductor layer is formed such that the first conductor portion of the conductor circuit has the thickness in a range of from 3.5 μm to 6.5 μm and that the second conductor portion of the conductor circuit has the thickness in a range of from 1 μm to 4 μm.

7. A printed wiring board according to claim 1, wherein the first via conductor and the conductor circuit of the second conductor layer are an integral conductor structure formed in a same process.

8. A printed wiring board according to claim 7, wherein the conductor circuit in the second conductor layer is formed such that the first conductor portion of the conductor circuit has the thickness in a range of from 3.5 μm to 6.5 μm and that the second conductor portion of the conductor circuit has the thickness in a range of from 1 μm to 4 μm.

9. A printed wiring board according to claim 1, wherein the second conductor layer comprises another conductor circuit formed on the first resin insulating layer and having a first conductor portion and a second conductor portion integrally formed such that the second conductor portion is surrounding the first conductor portion and that the first conductor portion has a thickness which is greater than a thickness of the second conductor portion.

10. A printed wiring board according to claim 9, wherein the conductor circuit in the second conductor layer is formed such that the first conductor portion of the conductor circuit has the thickness in a range of from 3.5 μm to 6.5 μm and that the second conductor portion of the conductor circuit has the thickness in a range of from 1 μm to 4 μm.

11. A method for manufacturing a printed wiring board, comprising:

forming a first conductor layer;

forming a first resin insulating layer on the first conductor layer;

forming, on the first resin insulating layer, a second conductor layer including a conductor circuit;

forming a second resin insulating layer on the second conductor layer such that the second resin insulating layer has a via opening reaching to the conductor circuit of the second conductor layer;

forming a first via conductor through the first resin insulating layer such that the first via conductor connects the first conductor layer and the second conductor layer and that the conductor circuit of the second conductor layer forms a land of the first via conductor; and forming a second via conductor in the via opening of the second resin insulating layer such that the second via conductor connects to the conductor circuit of the second conductor layer, wherein the forming of the conductor circuit of the second conductor layer comprises integrally forming a first conductor portion and a second conductor portion such that the first conductor portion connects to the via opening of the second resin insulating layer, that the second conductor portion surrounds the first conductor portion and that the first conductor portion has a thickness which is greater than a thickness of the second conductor portion, the conductor circuit in the second conductor layer is formed such that the first conductor portion of the conductor circuit is formed on the first via conductor, that the second conductor portion of the conductor circuit is formed on the first resin insulating layer, that the first conductor portion is consisting of an electrolytic plating film and that the second conductor portion comprises a seed layer and an electrolytic plating film formed on the seed layer.

12. A method for manufacturing a printed wiring board according to claim 11, wherein the forming of the second conductor layer comprises forming, on a surface of the first resin insulating layer, a plating resist for forming the conductor circuit, forming a plating film on the surface of the first resin insulating layer such that the plating film is formed on a surface portion exposed from the plating resist, forming an etching resist on the plating film exposed from the plating resist, thinning the plating film exposed from the etching resist such that the conductor circuit having the first conductor portion and the second conductor portion is formed, removing the etching resist, and removing the plating resist.

13. A method for manufacturing a printed wiring board according to claim 11, further comprising:
forming a third conductor layer on the second resin insulating layer,
wherein the forming of the second via conductor comprises forming, in the via opening, the second via conductor such that the second via conductor connects the second conductor layer and the third conductor layer.

14. A method for manufacturing a printed wiring board according to claim 11, wherein the forming of the second resin insulating layer comprises applying laser upon the second resin insulating layer such that the via opening is formed through the second resin insulating layer.

15. A printed wiring board, comprising:
a first conductor layer;
a first resin insulating layer formed on the first conductor layer;
a second conductor layer formed on the first resin insulating layer and including a conductor circuit;
a second resin insulating layer formed on the second conductor layer and having a via opening reaching to the conductor circuit of the second conductor layer; and
a first via conductor formed through the first resin insulating layer such that the first via conductor is connecting the first conductor layer and the second conductor layer and that the conductor circuit of the second conductor layer is forming a land of the first via conductor; and
a second via conductor formed in the via opening of the second resin insulating layer such that the second via conductor is connecting to the conductor circuit of the second conductor layer,
wherein the conductor circuit of the second conductor layer comprises a first conductor portion and a second conductor portion integrally formed such that the first conductor portion is connected to the via opening of the second resin insulating layer, that the second conductor portion is surrounding the first conductor portion and that the first conductor portion has a thickness which is greater than a thickness of the second conductor portion, the conductor circuit in the second conductor layer is formed such that the first conductor portion of the conductor circuit is formed on the first via conductor and that the second conductor portion of the conductor circuit is formed on the first resin insulating layer, the second conductor layer comprises another conductor circuit formed on the first resin insulating layer and having a first conductor portion and a second conductor portion integrally formed such that the second conductor portion is surrounding the first conductor portion and that the first conductor portion has a thickness which is greater than a thickness of the second conductor portion, the conductor circuit in the second conductor layer is formed such that the first conductor portion is consisting of an electrolytic plating film and that the second conductor portion comprises a seed layer and an electrolytic plating film formed on the seed layer, and the other conductor circuit in the second conductor layer is formed such that the first and second conductor portions comprise a seed layer and an electrolytic plating film formed on the seed layer.

16. A printed wiring board according to claim 15, further comprising:
a third conductor layer formed on the second resin insulating layer,
wherein the second via conductor is formed such that the second via conductor is connecting the second conductor layer and the third conductor layer.

17. A printed wiring board according to claim 16, wherein the conductor circuit in the second conductor layer is formed such that the first conductor portion of the conductor circuit has the thickness in a range of from 3.5 μm to 6.5 μm and that the second conductor portion of the conductor circuit has the thickness in a range of from 1 μm to 4 μm.

18. A printed wiring board according to claim 15, wherein the conductor circuit in the second conductor layer is formed such that the first conductor portion of the conductor circuit has the thickness in a range of from 3.5 μm to 6.5 μm and that the second conductor portion of the conductor circuit has the thickness in a range of from 1 μm to 4 μm.

19. A printed wiring board according to claim 15, wherein the conductor circuit in the second conductor layer is formed such that the first conductor portion of the conductor circuit has a substantially flat upper surface facing the via opening.

20. A printed wiring board according to claim 15, wherein the first via conductor and the conductor circuit of the second conductor layer are an integral conductor structure formed in a same process.

\* \* \* \* \*